US009344105B2

(12) United States Patent
Li et al.

(10) Patent No.: US 9,344,105 B2
(45) Date of Patent: May 17, 2016

(54) SUCCESSIVE APPROXIMATION ANALOG-TO-DIGITAL CONVERTER AND CONVERSION METHOD THEREOF

(71) Applicant: China Electronic Technology Corporation, 24th Research Institute, Chongqing (CN)

(72) Inventors: Ting Li, Chongqing (CN); Ru-Zhang Li, Chongqing (CN); Yong Zhang, Chongqing (CN); Zheng-Bo Huang, Chongqing (CN); Guang-Bing Chen, Chongqing (CN); Jian-An Wang, Chongqing (CN); Yu-Xin Wang, Chongqing (CN); Dong-Bing Fu, Chongqing (CN); Yan Wang, Chongqing (CN); Xu Wang, Chongqing (CN)

(73) Assignee: CHINA ELECTRONIC TECHNOLOGY CORPORATION, 24TH RESEARCH INSTITUTE, Chongqing (CN)

( * ) Notice: Subject to any disclaimer, the term of this patent is extended or adjusted under 35 U.S.C. 154(b) by 0 days.

(21) Appl. No.: 14/890,160

(22) PCT Filed: May 5, 2014

(86) PCT No.: PCT/CN2014/076788
§ 371 (c)(1),
(2) Date: Nov. 9, 2015

(87) PCT Pub. No.: WO2015/165125
PCT Pub. Date: Nov. 5, 2015

(65) Prior Publication Data
US 2016/0112059 A1    Apr. 21, 2016

(30) Foreign Application Priority Data

Apr. 29, 2014  (CN) .......................... 2014 1 0177109

(51) Int. Cl.
*H03M 1/06* (2006.01)
*H03M 1/42* (2006.01)
*H03M 1/12* (2006.01)

(52) U.S. Cl.
CPC .......... *H03M 1/0675* (2013.01); *H03M 1/1245* (2013.01); *H03M 1/42* (2013.01)

(58) Field of Classification Search
CPC ... H03M 1/0675; H03M 1/1038; H03M 1/42; H03M 1/0692
USPC .......... 341/163, 155, 156, 144, 120, 128, 172
See application file for complete search history.

(56) References Cited

U.S. PATENT DOCUMENTS 6,424,276 B1 * 7/2002 Munoz ................ H03M 1/1061
341/115
2008/0001804 A1 * 1/2008 Draxelmayr .......... H03M 1/069
341/155

(Continued)

FOREIGN PATENT DOCUMENTS

CN    102801422 A    11/2012
CN    103095300 A    5/2013

(Continued)

*Primary Examiner* — Peguy Jean Pierre
(74) *Attorney, Agent, or Firm* — Cheng-Ju Chiang

(57) ABSTRACT

A successive approximation analog-to-digital converter and conversion method thereof are provided, the successive approximation analog-to-digital converter includes a segmented-multiple-stage capacitor array with redundancy bits, a comparator, a weight-storage circuit, a code reconstruction circuit and a control logic circuit. The successive approximation analog-to-digital converter helps to decrease the complexity of circuit design, featuring small size and low power. Without auxiliary capacitor array, switches and control logic, the circuit can work to precisely measure and correct capacitor mismatch errors.

14 Claims, 4 Drawing Sheets

(56) References Cited

U.S. PATENT DOCUMENTS

| | | | |
|---|---|---|---|
| 2013/0147649 A1* | 6/2013 | Cheong | H03M 1/0682 341/172 |
| 2014/0184435 A1* | 7/2014 | Wang | H03M 1/38 341/161 |
| 2015/0222288 A1* | 8/2015 | Hurrell | H03M 1/002 341/118 |
| 2015/0263756 A1* | 9/2015 | Chiu | H03M 1/468 341/118 |

FOREIGN PATENT DOCUMENTS

| | | |
|---|---|---|
| CN | 103166644 A | 6/2013 |
| CN | 103199864 A | 7/2013 |
| CN | 103281083 A | 9/2013 |
| CN | 103618550 A | 3/2014 |
| EP | 2624458 A2 | 8/2013 |
| WO | 2007/145665 A2 | 12/2007 |

* cited by examiner

SUCCESSIVE APPROXIMATION ANALOG-TO-DIGITAL CONVERTER AND CONVERSION METHOD THEREOF

FIELD

The subject matter herein generally relates to Analog-to-Digital Converters (ADCs). Specifically, the present invention provides a successive approximation Analog-to-Digital Converter and conversion method thereof.

BACKGROUND

A successive approximation analog-to-digital converter generally comprises a capacitor array which has precision thereof determines precision of the successive approximation Analog-to-Digital Converter. Three problems need to be solved in regard to successive approximation Analog-to-Digital Conversion.

1. Structure problem of capacitor array a. If single-segment architecture is adopt, the number of unit capacitor is expressed as follows:

$$2^{N_s} \qquad (1)$$

Wherein, $N_s$ denotes the resolution of A/D converters. The number of unit capacitors increases at an exponential rate as the resolution of A/D converters increases. The size and power consumption of chip increases when the resolution of A/D converters $N_s$ increases. Normally, capacitor mismatch error needs to be corrected when the resolution of A/D converters $N_s$ is larger than 10.

b. If segment architecture is adopted, the number of unit capacitors dramatically decreases. For instance, when $N_s$ is even number, the structure of capacitor arrays is divided into two identical structures, then the number of unit capacitors is expressed as follow:

$$2 \cdot 2^{\frac{N_s}{2}} + 1 \qquad (2)$$

In doing so, the number of unit capacitors dramatically decreases especially when $N_s$ is large. Multiple-segment structure tends to bring mismatch errors of equivalent capacitors. Therefore, capacitor mismatch error correction is in need for multiple-segment structure which is more complicated than that for single-segment architecture. Traditional capacitor mismatch error correction works to use compensation capacitor array to compensate capacitor mismatch error. That is to say, when a capacitor is involved in the addition of electric charges, a corresponding compensation capacitor array is added to compensate the variation of electric charges caused by mismatch error. The compensation capacitor array features the resolution less than 1 least significant bit (LSB). Therefore, if $N_s$ is large, compensation capacitor array tends to apply a complicated structure to realize high resolution for compensation, which is too complicated to be realized.

A traditional successive approximation analog-to-digital converter works to apply digital correction by recording each capacitor's weight. Even though the weight of each capacitor can be correctly measured, code omission occurs when the weight of the high significant bit is larger than the sum of the weights of the rest bits plus 1 LSB. Take a 4 bit A/D converter as an example. Its actual weights are 9, 3, 2 and 1. The input/output values are correspondingly listed as follows:

| In  | 0 | 1 | 2  | 3  | 4  | 5  | 6  | 7  |
|-----|---|---|----|----|----|----|----|----|
| Out | 0 | 1 | 2  | 3  | 4  | 5  | 6  | 6  |
| In  | 8 | 9 | 10 | 11 | 12 | 13 | 14 | 15 |
| Out | 6 | 9 | 10 | 11 | 12 | 13 | 14 | 15 |

Wherein, the output code 7 and 8 are missing.

Therefore, an improved structure needs to be made for successive approximation analog-to-digital (A/D) converters.

CONTENTS OF THE INVENTION

It is an object of the invention to provide a successive approximation converter and conversion method thereof to reduce the complexity of circuit design and to have small size and low power consumption. And without auxiliary capacitor array, switches and control logic, the converter can work to precisely measure and correct capacitor mismatch errors.

The foregoing object of the invention is accomplished by using the following techniques.

The invention provides a successive approximation analog-to-digital converter, including a segmented-multiple-stage capacitor array with redundancy bits, comparator, weight-storage circuit, code reconstruction circuit and control logic.

The converter works to sample input voltage and then generates output voltage Vout+ and Vout− under the control of the logic circuit, wherein the segmented-multiple-stage capacitor array with redundancy bits includes the first stage capacitor array, the second stage capacitor array, . . . , the m stage capacitor array, the first segment capacitor C1, the second segment capacitor C2, . . . and the m-1 segment capacitor C(m-1). Each stage capacitor array of the previous m-1 stages comprises at least one redundancy bit. The minimum number of redundancy bit required by the m stage capacitor array depends on the maximum of capacitor mismatch caused by process capability, wherein, m is a positive integer no less than 2.

The comparator is employed to compare the output voltage Vout+ and Vout− and then generate a result.

The weight-storage circuit is employed to record the weight of each unit capacitor of segmented-multiple-stage capacitor array with redundancy bits.

The code reconstruction circuit is employed for successive approximation analog-to-digital converter to calculate an output code according to the output of the comparator and the capacitor's weight from weight-storage circuit.

The control logic circuit is employed to control the foregoing segmented-multiple-stage capacitor array with redundancy bits, comparator, weight-storage circuit and code reconstruction circuit.

Where, the maximum of capacitor mismatch error caused by process and circuit design is $N_{mismatch\_max}$ LSB. The number of minimum redundancy bit of the m stage capacitor array is expressed as the following equation: $N_{r\_min} = \log_2 (2 \cdot N_{mismatch\_max})$ Wherein, the redundancy bit of segmented-multiple-stage capacitor array starts at the one after the significant bit featuring as same weight as the redundancy bit does.

The first-stage capacitor array comprises positive-end capacitor $C_{11}, C_{12}, \ldots, C_{1i}, C_{1r}, C_{1(i+1)}, \ldots, C_{1n_1}, C_{1n_1}$, and negative-end capacitor $C'_{11}, C'_{12}, \ldots, C'_{1i}, C'_{1r}, C'_{1(i+1)}, \ldots, C'_{1n_1}, C'_{1n_1}$. $C_{11}$ and $C'_{11}$ make up of one group featuring the same weight $W_{11}$; $C_{12}$ and $C'_{12}$ make up of one group featuring the same weight $W_{12}$; $\ldots$; $C_{1n_1}$ and $C'_{1n_1}$ make up of one group featuring the same weight $W_{1n_1}$; redundancy capacitor $C_{1r}$ and $C'_{1r}$ make up of one group featuring the same weight $W_{1r}$;

The second-stage capacitor array comprises positive-end capacitor $C_{21}, C_{22}, \ldots, C_{2i}, C_{2r}, C_{2(i+1)}, \ldots, C_{2n_2}$ and negative-end capacitor $C'_{21}, C'_{22}, \ldots, C'_{2i}, C'_{2r}, C'_{2(i+1)}, \ldots, C'_{2n_2}$. $C_{21}$ and $C'_{21}$ make up of one group featuring the same weight $W_{21}$; $C_{22}$ and $C'_{22}$ make up of one group featuring the same weight $W_{22}$; $\ldots$; $C_{2n_2}$ and $C'_{2n_2}$ make up of one group featuring the same weight $W_{2n_2}$; redundancy capacitor $C_{2r}$ and $C'_{2r}$ make up of one group featuring the same weight $W_{2r}$;

In the same manner, the m stage capacitor array comprises positive-end capacitor $C_{m1}, C_{m2}, \ldots, C_{mi}, C_{mr1}, C_{m(i+1)}, \ldots, C_{mn_m}, C_{mr2}, \ldots, C_{mrk}$ and negative-end capacitor $C'_{m1}, C'_{m2}, \ldots, C'_{mi}, C'_{mr1}, C'_{m(i+1)}, \ldots, C'_{mn_m}, C'_{mr2}, \ldots, C'_{mrk}$. Capacitor $C_{m1}$ and $C'_{m1}$ make up of one group featuring the same weight $W_{m1}$; Capacitor $C_{m2}$ and $C'_{m2}$ make up of one group featuring the same weight $W_{m2}$; Capacitor $C_{mn_m}$ and $C'_{mn_m}$ make up of one group featuring the same weight $W_{mn_m}$; Capacitor $C_{mr1}$ and $C'_{mr1}$ make up of one group featuring the same weight $W_{mr1}$; $\ldots$; and redundancy capacitor $C_{mrk}$ and $C'_{mrk}$ make up of one group featuring the same weight $W_{mrk}$.

The first segment capacitor $C_1$ is twice than the last capacitor $C_{1n_1}$ of the first-stage capacitor array and capacitor $C_1$ equals to $C'_1$; The second segment capacitor $C_2$ is twice than the last capacitor $C_{n_2}$ of the second-stage capacitor array and capacitor $C_2$ equals to $C'_2$; $\ldots$; The m-1 segment capacitor $C_{(m-1)}$ is twice than the last capacitor $C_{(m-1)n_{(m-1)}}$ of the second-stage capacitor array and capacitor $C_{(m-1)}$ equals to $C'_{(m-1)}$.

The segmented-multiple-stage capacitor array with redundancy bits is connected to comparators by using either differential structure or single-end structure.

According to the converter, successive approximation analog-to-digital conversion technique is presented, wherein, The segmented-multiple-stage capacitor array with redundancy bits samples;

Switches of the first-stage capacitor array are connected to $V_{cm}$, and the first-stage capacitor array works to generate the first output of voltage Vout+ and Vout−;

The first output voltage Vout+ and Vout− are compared by comparator which outputs a result $R_{11}$;

The result $R_{11}$ is used to control the switch $K_{11}$, generating the second output voltage Vout+ and Vout−; code reconstruction circuit is employed to obtain the weight $W_{11}$ of capacitor $C_{11}$ connected with the switch $K_{11}$ from weight-storage circuit and calculate an output weight being expressed as the equation: $D_{out}=R_{11} \cdot W_{11}$ The second output of voltage Vout+ and Vout− are compared by comparators outputting a result $R_{12}$;

The result $R_{12}$ is used to control the switch $K_{12}$, generating the third output voltage Vout+ and Vout−; code reconstruction circuit is employed to read the weight $W_{12}$ of capacitor $C_{12}$ connected with the switch $K_{12}$ from weight-storage circuit and calculate an output weight being added to the previous result as follows: $D_{out}=R_{11} \cdot W_{11}+R_{12} \cdot W_{12}$ In the same manner till the last control switch $K_{mrk}$, a result is obtained from code reconstruction circuit being expressed as the following equation: $D_{out}=R_{11} \cdot W_{11}+R_{12} \cdot W_{12}+\ldots+R_{mrk} \cdot W_{mrk}$ If an output voltage Vout+ is larger than Vout−, the comparator outputs 1, otherwise the comparator outputs 0.

Besides, a method is described to measure capacitor mismatch error, wherein,

Weight-storage circuit is initialized with ideal weight;

Analog-to-digital conversion is carried out, generating a result from comparator and an output code from code reconstruction circuit;

Under the restriction of minimized sum of deviation square, a curve is fit based on output codes from code reconstruction circuit;

The actual weight of capacitors is estimated based on the difference between the true output curve and the fit one;

Weight-storage circuit is initialized with ideal weight;

Wherein, the number of significant bit of the first-stage capacitor array is $n_1$; the number of significant bit of the second-stage capacitor array is $n_2, \ldots$, the number of significant bit of the m-stage capacitor array is $n_m$; the ideal weight $W_{11}$ of the most significant bit of the first-stage capacitor array is $W_{ideal11}$, being expressed as equation $W_{ideal11}=2^{n_1+n_2+\ldots+n_m-1}$, the ideal weight $W_{12}$ of the second most significant bit of the first-stage capacitor array is $W_{ideal12}$, being expressed as equation $W_{ideal12}=2^{n_1+n_2+\ldots+n_m-2}, \ldots$, the ideal weight $W_{m1}$ of the first significant bit of the m-stage capacitor array is $W_{idealm1}$, being expressed as equation $W_{idealm1}=2^{2n_m-1}$; the ideal weight $W_{m2}$ of the second most significant bit of the m-stage capacitor array is $W_{idealm2}$, being expressed as equation $W_{idealm2}=2^{n_m-2}, \ldots$, the ideal weight $W_{mn_m}$ of the $n_m$ significant bit of the m-stage capacitor array is 1;

The weight of the redundancy bit is set, wherein, the ideal weight of redundancy bit of the first stage capacitor array equals to its previous significant bit, namely, $W_{ideal1r}=W_{ideal1i}$; the ideal weight of redundancy bit of the second stage capacitor array equals to that of the previous significant bit, namely, $W_{ideal2r}=W_{ideal2i}$; $\ldots$, the ideal weight of redundancy bit of the m stage capacitor array equals to its previous significant bit. There may exit a plenty of redundancy bits, namely $$W_{idealmrk}=2^0=1$$

$$W_{idealmr(k-1)}=2^1=2$$

$$W_{idealmr(k-2)}=2^2=4$$

$\ldots$ $$W_{idealmr1}=2^{k-1}$$

Then analog-to-digital conversion is carried out to generate an output from comparators and an output code from code reconstruction circuit;

Wherein, the amplitude of the input signal should be larger than half the Analog-to-Digital Converters (ADC) input signal range.

Analog-to-digital conversion is carried out based on the ideal weights to obtain an output from comparators and an output code from code reconstruction circuit. The number N of sample point must be larger than $2^{n_1+n_2+\ldots+n_m}$, (n is a natural number larger than 1).

Under the restriction of minimized sum of deviation square, a curve is fit based on output codes from code reconstruction circuit covering the following steps:

Assume input signal is expressed as function f(i), output signal as function $D_{out}(i)$; i and $D_{out}(i)$ are given; Under the restriction of minimized sum of deviation square $$\min \sum_i \left( \hat{f}(i) - D_{out}(i) \right)^2,$$

an input signal curve $\hat{f}(i)$ is drawn, where i=1, 2, ..., N.

The weight of capacitors is estimated based on the difference between the true output curve and the fit one.

a. Calculate the difference between the first output and the calculated one, the difference err(1) is expressed as equation:

$$err(1) = D_{out}(1) - \hat{f}(1)$$

b. According to the proportion of weights, the actual weight of capacitor is expressed as follows:

$$W_{11}(1) = W_{ideal11} - \mu \frac{W_{ideal11} \cdot R_{11}(1) \cdot err(1)}{\sum W_{ideal11} + W_{ideal12} + \ldots + W_{idealmrk}}$$

$$W_{12}(1) = W_{ideal12} - \mu \frac{W_{ideal12} \cdot R_{12}(1) \cdot err(1)}{\sum W_{ideal11} + W_{ideal12} + \ldots + W_{idealmrk}}$$

...

$$W_{mrk}(1) = W_{idealmrk} - \mu \frac{W_{idealmrk} \cdot R_{mrk}(1) \cdot err(1)}{\sum W_{ideal11} + W_{ideal12} + \ldots + W_{idealmrk}}$$

Where, μ is stepwise regression; 0<μ<1

If process deviation can make sure that the weight of the bits after the p bit of the m capacitor array has no influence on the monotonic of capacitor array, then ignore the capacitor mismatch error of which the weight being less than $W_{mp}$, and take it as an ideal weight which is expressed as equation:

$$W_{11}(1) = W_{ideal11} - \mu \frac{W_{ideal11} \cdot R_{11}(1) \cdot err(1)}{\sum W_{ideal11} + W_{ideal12} + \ldots + W_{idealmp}}$$

$$W_{12}(1) = W_{ideal12} - \mu \frac{W_{ideal12} \cdot R_{12}(1) \cdot err(1)}{\sum W_{ideal11} + W_{ideal12} + \ldots + W_{idealmp}}$$

...

$$W_{mp}(1) = W_{idealmp} - \mu \frac{W_{idealmp} \cdot R_{mp}(1) \cdot err(1)}{\sum W_{ideal11} + W_{ideal12} + \ldots + W_{idealmp}}$$

c. An output is estimated according to the estimated weight:

$$D_{out\_est}(1) = R_{11}(2) \cdot W_{11}(1) + R_{12}(2) \cdot W_{12}(1) + \ldots + R_{mrk}(2) \cdot W_{mrk}(1)$$

d. The error is calculated according to the estimated output and the calculated one.

$$err(2) = D_{out\_est}(1) - \hat{f}(2)$$

e. According to the error and the proportion of weight, the actual weight of capacitors is re-estimated.

$$W_{11}(2) = W_{11}(1) - \mu \frac{W_{ideal11} \cdot R_{11}(2) \cdot err(2)}{\sum W_{ideal11} + W_{ideal12} + \ldots + W_{idealmrk}}$$

$$W_{12}(2) = W_{12}(1) - \mu \frac{W_{ideal11} \cdot R_{12}(2) \cdot err(2)}{\sum W_{ideal11} + W_{ideal12} + \ldots + W_{idealmrk}}$$

...

-continued $$W_{mrk}(2) = W_{mrk}(1) - \mu \frac{W_{idealmrk} \cdot R_{mrk}(2) \cdot err(2)}{\sum W_{ideal11} + W_{ideal12} + \ldots + W_{idealmrk}}$$

If process deviation can make sure that the weight of the bits after the p bit of the m capacitor array has no influence on the monotonic of capacitor array, then ignore the capacitor mismatch error of which the weight being less than $W_{mp}$, and take it as an ideal weight which is expressed as equation:

$$W_{11}(2) = W_{11}(1) - \mu \frac{W_{ideal11} \cdot R_{11}(2) \cdot err(2)}{\sum W_{ideal11} + W_{ideal12} + \ldots + W_{idealmp}}$$

$$W_{12}(2) = W_{12}(1) - \mu \frac{W_{ideal12} \cdot R_{12}(2) \cdot err(2)}{\sum W_{ideal11} + W_{ideal12} + \ldots + W_{idealmp}}$$

...

$$W_{mp}(2) = W_{mp}(1) - \mu \frac{W_{idealmp} \cdot R_{mrk}(2) \cdot err(2)}{\sum W_{ideal11} + W_{ideal12} + \ldots + W_{idealmp}}$$

f. The cycle of estimation from the step c to step e can be done till the N estimation and there comes out the last estimated weight $W_{11}(N), W_{12}(N), \ldots, W_{mrk}(N)$.

Besides, the capacitor mismatch error is corrected;

Wherein, the estimated capacitor weight is written in weight-storage circuit;

Analog-to-digital conversion is carried out, outputting a code from code reconstruction circuit after the actual capacitor weight being corrected.

The invention has following advantages:

First of all, the segment structure is improved for capacitor array of successive approximation analog-to-digital converters, which greatly decreases the number of unit capacitors and realizes small layout size and low power consumption. For example, a 10-bit A/D converter with a traditional non-segment-structure features unit capacitors of $2^{10} = 1024$. By using the segmented-structure of two segments, it features unit capacitors of $$2 \times \left(2^{\frac{10}{2}} + 1\right) + 1 = 67,$$

being reduced by 93.5%.

Second, code omission may happen to the capacitor array with either the traditional single-end or the traditional segment structure when digital correction is employed for capacitor mismatch error. By using the improved segment structure, the digital correction can be employed for capacitor mismatch error of successive approximation analog-to-digital converter.

Third, the invention discloses a successive approximation analog-to-digital converter featuring no auxiliary capacitor array, switches and control logic for measuring mismatch error, which greatly decreases the complexity of circuit design, layout size and power consumption.

Fourth, the invention discloses a successive approximation analog-to-digital converter featuring higher resolution than the traditional one using analog measure manner which is limited by auxiliary measuring capacitor array. By using digital measure manner for capacitor mismatch, the process capability has no effect on the resolution of error-measurement.

Fifth, the compensate capacitance array and related circuit used for capacitance mismatch error correction are eliminated, the design complexity of analog circuit is reduced greatly and the layout area and power consumption of the Analog-to-Digital Converters (ADC) are saved.

Sixth, the correction technique for the capacitor mismatch error features high resolution. By using digital correction technique, the correction technique features as the same resolution as the error measure technique does. As for the traditional analog correction, it features the resolution being limited to the minimum of compensation capacitor which is defined by process capability. As a result, the resolution of capacitor mismatch error compensation is less than that for error measure technique.

DETAILED DESCRIPTION

Figure 1:
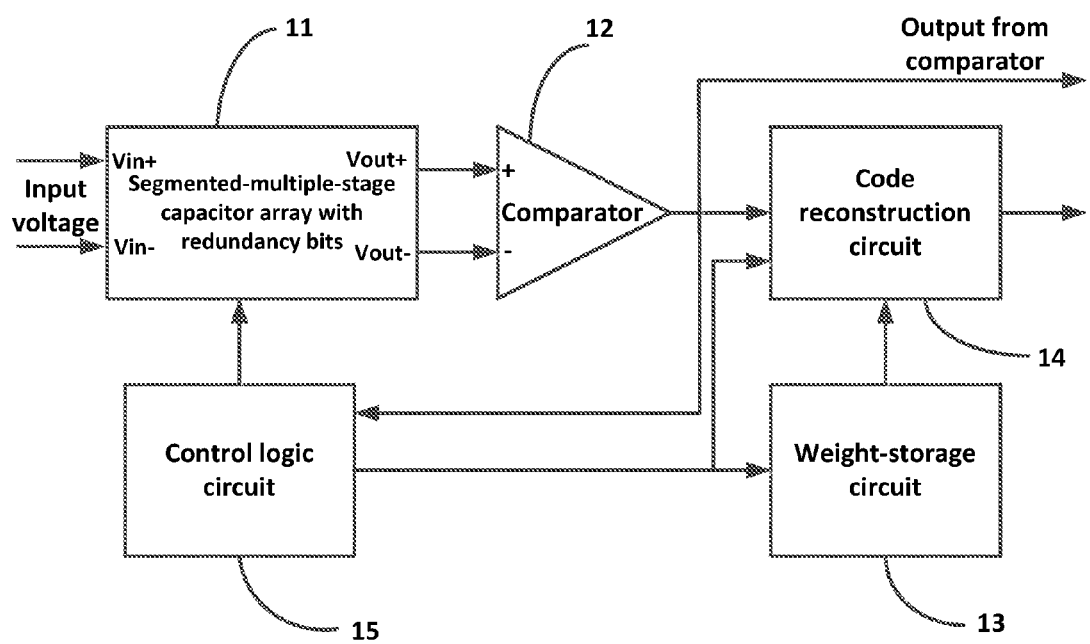
FIG. 1 is a block diagram showing a successive approximation analog-to-digital converter with redundancy bits.

According to FIG. 1, according to an embodiment of the invention, the successive approximation analog-to-digital converter includes a segmented-multiple-stage capacitor array 11 with redundancy bits, a comparator 12, a weight-storage circuit 13, a code reconstruction circuit 14 and a control logic circuit 15.

The successive approximation analog-to-digital converter's working principle is described as follow: The signal Vin+ and Vin− are input to segmented-multiple-stage capacitor array with redundancy bits 11. The segmented-multiple-stage capacitor array with redundancy bits 11 is controlled by the control logic circuit 15 to sample the signals and generate output voltage Vout+ and Vout−. Then the output voltage is compared by the comparator 12. The foregoing steps keep in cycle till the switch of the last unit capacitor. The output result from the comparator 12 is sent to the code reconstruction circuit 14. The result from the comparator 12 and the weight data from the weight-storage circuit 13 are recoded by the code reconstruction circuit 14. An output is obtained from the A/D converter, and separately an output from comparator 12 being used to measure the actual weight of capacitors.

Figure 2:
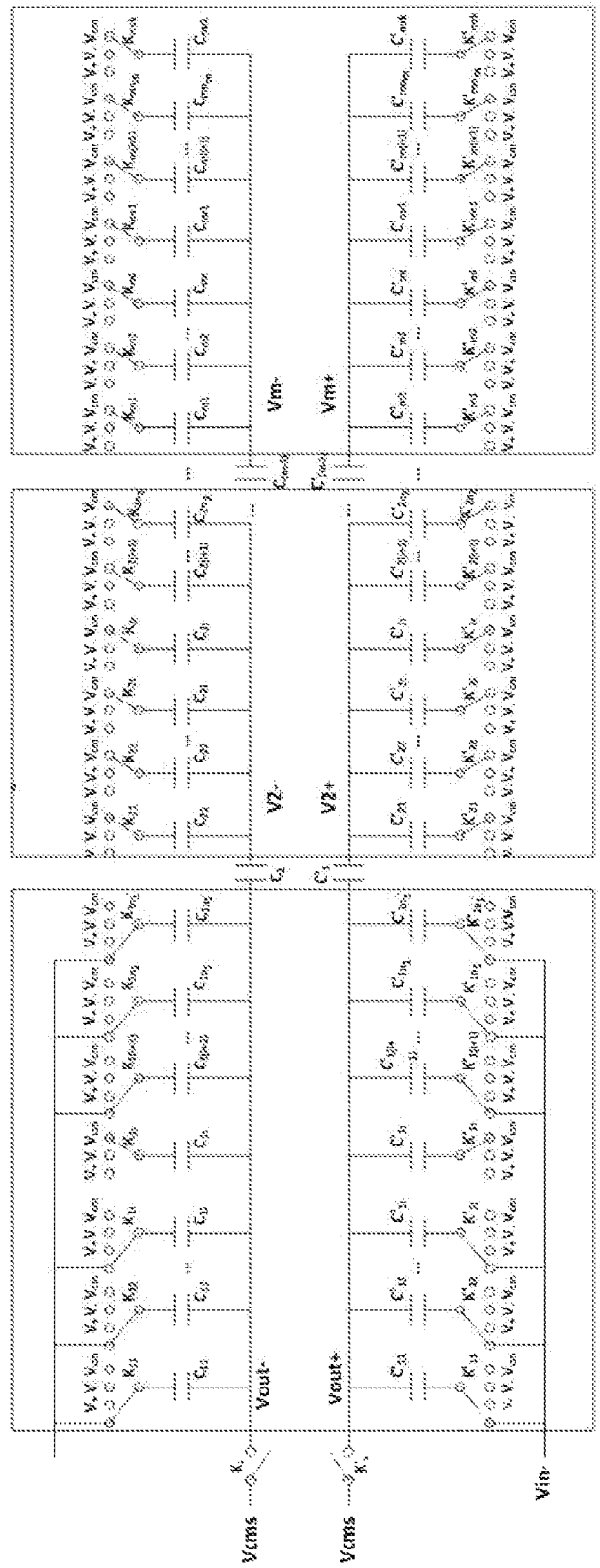
FIG. 2 is a schematic diagram showing a segmented-multiple-stage capacitor array with redundancy bits as shown in FIG. 1.

The segmented-multiple-stage capacitor array with redundancy bits 11 is mainly employed to sample input voltages and generate output voltages Vout+ and Vout− under the control of logic circuit. The output voltages are compared by comparators. According to the outputs from comparators, the switches are altered one after another under the control of logic circuit. Then the output voltage Vout+ and Vout− are regenerated being sent to comparators for another comparison. The cycle of the steps is carried on till the switch of the last unit capacitor being reset. As shown in FIG. 2, the preferred embodiment shows a segmented-multiple-stage capacitor array with redundancy bits comprising the first stage capacitor array, the second stage capacitor array ... the m stage capacitor array, the first segment capacitor $C_1$, the second segment capacitor $C_2$, ..., the m-1 segment capacitor $C_{(m-1)}$, wherein m is any positive integer no less than 2.

The first stage capacitor array comprises positive-end capacitor $C_{11}, C_{12}, \ldots, C_{1i}, C_{1r}, C_{1(i+1)}, \ldots, C_{1n_1}, C_{1n_{1'}}$ and negative-end capacitor $C'_{11}, C'_{12}, \ldots, C'_{1i}, C'_{1r}, C'_{1(i+1)}, \ldots, C'_{1n_1}, C'_{1n_{1'}}$, positive-end switch $K_{11}, K_{12}, \ldots, K_{1i}, K_{1r}, K_{1(i+1)}, \ldots, K_{1n_1}, K_{1n_{1'}}$, and negative-end switch $K'_{11}, K'_{12}, \ldots, K'_{1i}, K'_{1r}, K'_{1(i+1)}, \ldots, K'_{1n_1}, K'_{1n_{1'}}$, wherein, $C_{11}$ is connected to Vout− and the other end of $C_{11}$ to switch $K_{11}$. The other end of $K_{11}$ is connected to one of Vin+, $V_+$, $V_−$ and $V_{cm}$ under the control of logic circuit; $C_{12}$ is connected to Vout− and the other end of $C_{12}$ to switch $K_{12}$. The other end of $K_{12}$ is connected to one of Vin+, $V_+$, $V_−$ and $V_{cm}$ under the control of logic circuit; ...; $C_{1n_{1'}}$ is connected to Vout− and the other end of $C_{1n_{1'}}$ to switch $K_{1n_{1'}}$. The other end of $K_{1n_{1'}}$ is connected to one of Vin+, $V_+$, $V_−$ and $V_{cm}$ under the control of logic circuit; redundancy capacitor $C_{1r}$ is connected to Vout− and the other end of $C_{1r}$ to switch $K_{1r}$. The other end of $K_{1r}$ is connected to one of $V_+$, $V_−$ and $V_{cm}$ under the control of logic circuit. Negative-end capacitor $C'_{11}$ is connected to Vout+ and the other end of $C'_{11}$ to switch $K'_{11}$. The other end of $K'_{11}$ is connected to one of Vin+, $V_+$, $V_−$ and $V_{cm}$; Negative-end capacitor $C'_{12}$ is connected to Vout+ and the other end of $C'_{12}$ to switch $K'_{12}$. The other end of $K'_{12}$ is connected to one of Vin+, $V_+$, $V_−$ and $V_{cm}$; ...; Negative-end capacitor $C'_{1n_{1'}}$ is connected to Vout+ and the other end of $C'_{1n_{1'}}$ to switch $K'_{1n_{1'}}$. The other end of $K'_{1n_{1'}}$ is connected to one of Vin+, $V_+$, $V_−$ and $V_{cm}$; redundancy capacitor $C'_{1r}$ is connected to Vout− and the other end of $C'_{1r}$ to switch $K'_{1r}$. The other end of $K'_{1r}$ is connected to one of $V_+$, $V_−$ and $V_{cm}$ under the control of logic circuit. Given an ideal condition, $C_{11}$ equals to $C'_{11}$, $C_{12}$ equals to $C'_{12}, \ldots, C_{1n_{1'}}$ equals to $C'_{1n_{1'}}$; and $C_{11}$ equals to two times of $C_{12}$, $C_{12}$ is two times of $C_{13}, \ldots, C_{1i}$ is two times of $C_{1(i+1)}$, $C_{1(n_1-1)}$ is two times of $C_{1n_1}$, $C_{1r}$ equals to $C_{1i}$, $C_{1n_1}$ equals to $C_{1n_{1'}}$; $C'_{1(n_1-1)}$ is two times of $C'_{1n_1}$, $C'_{1r}$ equals to $C'_{1i}$ and $C'_{1n_1}$ equals to $C'_{1n_{1'}}$.

The capacitor $C_1$ of the first segment is two times of the last capacitor $C_{1n_{1'}}$ of the first-stage capacitor array and $C_1$ equals to $C'_1$.

The second stage capacitor array comprises positive-end capacitor $C_{21}, C_{22}, \ldots, C_{2i}, C_{2r}, C_{2(i+1)}, \ldots, C_{2n_2}$ and negative-end capacitor $C'_{21}, C'_{22}, \ldots, C'_{2i}, C'_{2r}, C'_{2(i+1)}, \ldots, C'_{2n_2}$, positive-end switch $K_{21}, K_{22}, \ldots, K_{2i}, K_{2r}, K_{2(i+1)}, \ldots, K_{2n_2}$ and negative-end switch $K'_{21}, K'_{22}, \ldots, K'_{2i}, K'_{2r}, K'_{2(i+1)}, \ldots, K'_{2n_2}$, wherein, $C_{21}$ is connected to V2− and the other end of $C_{21}$ to switch $K_{21}$. The other end of $K_{21}$ is connected to one of $V_+$, $V_−$ and $V_{cm}$ under the control of logic circuit; $C_{22}$ is connected to V2− and the other end of $C_{22}$ to switch $K_{22}$. The other end of $K_{22}$ is connected to one of $V_+$, $V_−$ and $V_{cm}$ under the control of logic circuit; ...; $C_{2n_2}$ is connected to V2− and the other end of $C_{2n_2}$ to switch $K_{2n_2}$. The other end of $K_{2n_2}$ is connected to one of $V_+$, $V_−$ and $V_{cm}$ under the control of logic circuit; redundancy capacitor $C_{2r}$ is connected to V2− and the other end of $C_{2r}$ to switch $K_{2r}$. The other end of $K_{2r}$ is connected to one of $V_+$, $V_−$ and $V_{cm}$ under the control of logic circuit. Negative-end capacitor $C'_{21}$ is connected to V2+ and the other end of $C'_{21}$ to switch $K'_{21}$. The other end of $K'_{21}$ is connected to one of $V_+$, $V_−$ and $V_{cm}$; Negative-end capacitor $C'_{22}$ is connected to V2+ and the other end of $C'_{22}$ to switch $K'_{22}$. The other end of $K'_{22}$ is connected to one of $V_+$, $V_−$ and $V_{cm}$; ...; Negative-end capacitor $C'_{2n_2}$ is connected to V2+ and the other end of $C'_{2n_2}$ to switch $K'_{2n_2}$. The other end of $K'_{2n_2}$ is connected to one of $V_+$, $V_−$ and $V_{cm}$; redundancy capacitor $C'_{2r}$ is connected to V2− and the other end of $C'_{2r}$ to switch $K'_{2r}$. The other end of $K'_{2r}$ is connected to one of $V_+$, $V_−$ and $V_{cm}$ under the control of logic circuit. Given an ideal condition, $C_{21}$ equals to $C'_{21}$, $C_{22}$ equals to $C'_{22}, \ldots, C_{2n_2}$ equals to $C'_{2n_2}$; and $C_{21}$ equals to two times of $C_{22}$, $C_{22}$ is two times of $C_{23}, \ldots, C_{2i}$ is two times of $C_{2(i+1)}$, $C_{2(n_2-1)}$ is two times of $C_{2n_2}$, $C_{2r}$ equals to $C_{2i}$; under an ideal circumstance, $C'_{21}$ is two times of $C'_{22}$; $C'_{22}$ is two times of $C'_{23}, \ldots, C'_{2i}$ is two times of $C'_{2(i+1)}$; $C'_{2(n_2-1)}$ is two times of $C'_{2n_2}$; $C'_{2r}$ equals to $C'_{2i}$.

The capacitor $C_2$ of the second segment is two times of the last capacitor $C_{2n_2}$ of the second-stage capacitor array and $C_2$ equals to $C'_2$.

This can be done in the same manner till the m-stage capacitor array. That is to say, the m-stage capacitor array comprises positive-end capacitors $C_{m1}, C_{m2}, \ldots, C_{mi}, C_{mr1}, C_{m(i+1)}, \ldots, C_{mn_m}, C_{mr2} \ldots, C_{mrk}$ and negative-end capacitor $C'_{m1}, C'_{m2}, \ldots, C'_{mi}, C'_{mr1}, C'_{m(i+1)}, \ldots, C'_{mn_m}, C'_{mr2} \ldots, C'_{mrk}$, positive-end switch $K_{m1}, K_{m2}, \ldots, K_{mi}, K_{mr}, K_{m(i+1)}, \ldots, K_{mn_m}, K_{mr2}, \ldots, K_{mrk}$ and negative-end switch $K'_{m1}, K'_{m2}, \ldots, K'_{mi}, K'_{mr}, K'_{m(i+1)}, \ldots, K'_{mn_m}, K'_{mr2}, \ldots, K'_{mrk}$, wherein, $C_{m1}$ is connected to Vm– and the other end of $C_{m1}$ to switch $K_{m1}$. The other end of $K_{m1}$ is connected to one of $V_+$, $V_-$ and $V_{cm}$ under the control of logic circuit; $C_{m2}$ is connected to Vm– and the other end of $C_{m2}$ to switch $K_{m2}$. The other end of $K_{m2}$ is connected to any of $V_+$, $V_-$ and $V_{cm}$ under the control of logic circuit; $\ldots$; $C_{mn_m}$ is connected to Vm– and the other end of $C_{mn_m}$ to switch $K_{mn_m}$. The other end of $K_{mn_m}$ is connected to any of $V_+$, $V_-$ and $V_{cm}$ under the control of logic circuit; redundancy capacitor $C_{mrk}$ is connected to Vm– and the other end of $C_{mrk}$ to switch $K_{mrk}$. The other end of $K_{mrk}$ is connected to any of $V_+$, $V_-$ and $V_{cm}$ under the control of logic circuit. $C'_{m1}$ is connected to Vm+ and the other end of $C'_{m1}$ to switch $K'_{m1}$. The other end of $K'_{m1}$ is connected to any of $V_+$, $V_-$ and $V_{cm}$ under the control of logic circuit; $C'_{m2}$ is connected to Vm+ and the other end of $C'_{m2}$ to switch $K'_{m2}$. The other end of $K'_{m2}$ is connected to any of $V_+$, $V_-$ and $V_{cm}$ under the control of logic circuit; $\ldots$; $C'_{mn_m}$ is connected to Vm+ and the other end of $C'_{mn_m}$ to switch $K'_{mn_m}$. The other end of $K'_{mn_m}$ is connected to any of $V_+$, $V_-$ and $V_{cm}$ under the control of logic circuit; redundancy capacitor $C'_{mr1}$ is connected to Vm+ and the other end of $C'_{mr1}$ to switch $K'_{mr1}$. The other end of $K'_{mr1}$ is connected to any of $V_+$, $V_-$ and $V_{cm}$ under the control of logic circuit, $\ldots$, redundancy capacitor $C'_{mrk}$ is connected to Vm+ and the other end of $C'_{mrk}$ to switch $K'_{mrk}$. The other end of $K'_{mrk}$ is connected to any of $V_+$, $V_-$ and $V_{cm}$ under the control of logic circuit.

In the same manner, given an ideal circumstance, the capacitor $C_{(m-1)}$ of the m-1 segment is two times of the last capacitor $C_{(m-1)n_{(m-1)}}$ of the m-1 stage capacitor array and $C_{(m-1)}$ equals to $C'_{(m-1)}$.

Notice that each of the previous m-1 stage capacitor arrays features at least one redundancy bit being set at the bit right after the significant bit which has the same weight of the redundancy bit. The minimum number of redundancy bits of the last stage capacitor array is defined by the maximum of capacitor mismatch error which depends on process capability. If the maximum of capacitor mismatch error is expressed as $N_{mismatch\_max}$ LSB, then the minimum number of redundancy bit is expressed as $N_{r\_min} = \log_2(2 \cdot N_{mismatch\_max})$. The redundancy bit is set at the bit right after the significant bit featuring the same weight of the redundancy bit.

The comparator 12 is employed to compare the output voltage Vout+ and Vout– of the segmented-multiple-stage capacitor array with redundancy bits 11. If Vout+ is larger than Vout–, then the comparator 12 outputs 1, otherwise 0. The steps are described in details as follows:

1. At sampling phase, sample-switch $K_S$ and $K_{S'}$ are switched on. Vout+ and Vout– equal to common-mode sample voltage Vcms; For the first-stage capacitor array, the positive-end switches are connected to input voltage Vin+, except the switch $K_{1r}$ of redundancy bits and the negative-end switches are connected to input voltage Vin–, except the switch $K'_{1r}$ of redundancy bits; The switches of the second-stage capacitor array are connected to common-mode voltage Vcm; In the same way, from the third stage to the m stage capacitor array, the switches of the arrays are connected to Vcm; and the sampling phase does not end until the sample-switches $K_S$ and $K_{S'}$ being switched off.

2. At comparison phase, Vout+ and Vout– change by the time all switches of the first-stage capacitor array are connected to Vcm. Through comparison, if Vout+ is larger than Vout–, then it outputs $R_{11}=1$, being sent to logic circuit. The switch $K_{11}$ is connected to $V_+$ and $K'_{11}$ to $V_-$ under control of logic circuit. Otherwise, the circuit outputs $R_{11}=0$, and the switch $K_{11}$ is connected to $V_-$ and $K'_{11}$ to $V_+$. The circuit regenerates Vout+ and Vout–; At the second comparison, if Vout+ is larger than Vout–, the comparator outputs $R_{12}=1$, being sent to logic circuit. Under control of logic circuit, the switch $K_{12}$ is connected to $V_+$ and $K'_{12}$ to $V_-$. Otherwise, the comparator outputs $R_{12}=0$, which makes $K_{12}$ to be connected to $V_-$ and $K'_{12}$ to $V_+$. Vout+ and Vout– are regenerated. The comparison can be done in the same way till the switches of the m stage capacitor array being reset based on the outputs from the comparator of the m stage capacitor array.

And, the weight-storage circuit 13 is employed for storing capacitor's weight. For the first stage capacitor array, $C_{11}$ and $C'_{11}$ make up of one group featuring weight $W_{11}$; $C_{12}$ and $C'_{12}$ make up of one group featuring weight $W_{12}$; $\ldots$; $C_{1n_1}$ and $C'_{1n_1}$ make up of one group featuring weight $W_{1n_1}$; $C'_{1r}$ and $C'_{1r}$ make up of one group featuring weight $W_{1r}$. For the second stage capacitor array, $C_{21}$ and $C'_{21}$ make up of one group featuring weight $W_{21}$; $C_{22}$ and $C'_{22}$ make up of one group featuring weight $W_{22}$; $\ldots$; $C_{2n_2}$ and $C'_{2n_2}$ make up of one group featuring weight $W_{2n_2}$; $C_{2r}$ and $C'_{2r}$ make up of one group featuring weight $W_{2r}$. This can be done in the same manner till the m stage capacitor. For the m stage capacitor, $C_{m1}$ and $C'_{m1}$ make up of one group featuring weight $W_{m1}$; $C_{m2}$ and $C'_{m2}$ make up of one group featuring weight $W_{m2}$; $C_{mn_m}$ and $C'_{mn_m}$ make up of one group featuring weight $W_{mn_m}$; $C_{mr1}$ and $C'_{mr1}$ make up of one group featuring weight $W_{mr1}$; $\ldots$; $C_{mrk}$ and $C'_{mrk}$ make up of one group featuring weight $W_{mrk}$.

And, the code reconstruction circuit 14 is employed for calculating an output code according to the result from the comparator 12 and the capacitor weight from the weight-storage circuit 13. The steps are described in details as follows:

1) Read output result $R_{11}, R_{12}, \ldots, R_{mrk}$ from the comparator 12;

2) Read capacitors' weight $W_{11}, W_{12}, \ldots, W_{mrk}$;

3) Calculate the output code by adding up all results from capacitors by weight:

$$D_{out} = R_{11} \cdot W_{11} + R_{12} \cdot W_{12} + \ldots + R_{mrk} \cdot W_{mrk}$$

The logic control circuit 15 is employed to control the segmented-multiple-stage capacitor array 11, comparator 12, weight-storage circuit 13 and code reconstruction 14. The control of logic control circuit 15 reflects the conversion of successive approximation A/D converter. The conversion flow is described in details as follows:

1) the segmented-multiple-stage capacitor array with redundancy bits samples signals;

2) The logic control circuit works to connect all switches of the first-stage capacitor array to $V_{cm}$ and Vout+ and Vout– are output for the first time;

3) The comparison of first-output Vout+ and Vout– is carried out by the comparator producing a result $R_{11}$;

4) According to $R_{11}$, the switch $K_{11}$ is controlled by control logic circuit resulting to the second output of Vout+ and Vout–; meanwhile, the weight $W_{11}$ of capacitor $C_{11}$, being connected to $K_{11}$, is obtained from weight-storage circuit by code reconstruction circuit. The corresponding result is calculated as $D_{out}=R_{11}\cdot W_{11}$;

5) The comparison of second-output Vout+ and Vout− is carried out by the comparator producing a result $R_{12}$;

6) According to result $R_{12}$, the switch $K_{12}$ is controlled by control logic circuit resulting to the second output of Vout+ and Vout−; meanwhile, the weight $W_{12}$ of capacitor $C_{12}$, being connected to $K_{12}$, is obtained from weight-storage circuit by code reconstruction circuit. By adding the previous one, the result is calculated as $D_{out}=R_{11}\cdot W_{11}+R_{12}\cdot W_{12}$;

7) In the same manner till the last switch $K_{mrk}$, the circuit generates an output code being expressed as $D_{out}=R_{11}\cdot W_{11}+R_{12}\cdot W_{12}+\ldots+R_{mrk}\cdot W_{mrk}$.

Figure 3:
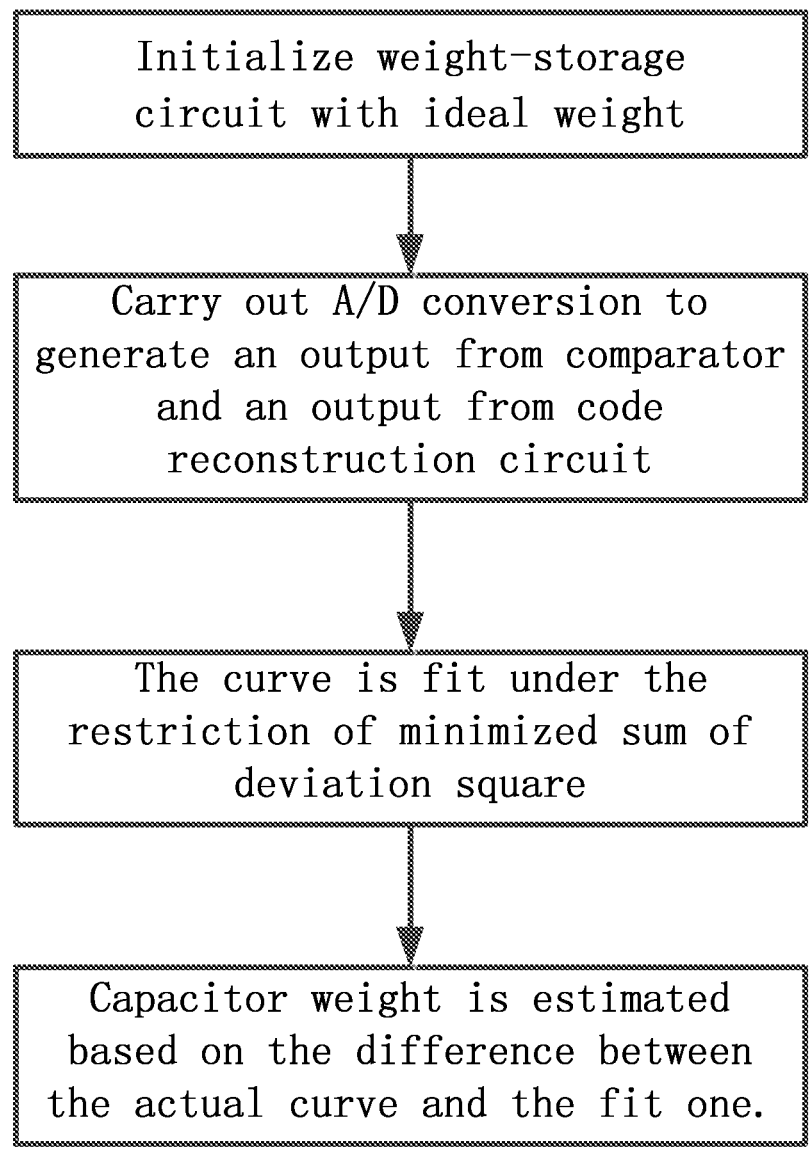
FIG. 3 is a flow chart showing the way to measure capacitor mismatch error for a successive approximation analog-to-digital converter with redundancy bits.

Still, the result $D_{out}$ may need to be corrected due to capacitor mismatch error. The invention discloses the way to measure capacitor mismatch error as shown in FIG. 3. The steps are described in details as follow:

1) Set the primitive weight of weight-storage circuit with ideal one.

a. Set the weight of significant bits

The number of significant bits of the first stage capacitor array is $n_1$, that of the second one is $n_2$ ... the number of significant bits of the m stage capacitor array is $n_m$. So the weight $W_{11}$ of the most significant bit of the first stage capacitor array is idealized as $W_{ideal11}=2^{n_1+n_2+\ldots+n_m-1}$, the weight $W_{12}$ of the second most significant bit of the first stage capacitor array is idealized as $W_{ideal12}=2^{n_1+n_2+\ldots+n_m-2}$, ..., the weight $W_{m1}$ of the most significant bit of the m stage capacitor array is idealized as $W_{idealm1}=2^{n_m-1}$; the weight $W_{m2}$ of the second most significant bit of the m stage capacitor array is idealized as $W_{idealm2}=2^{n_m-2}$, ..., the weight $W_{mn_m}$ of the $n_m$ significant bit of the m stage capacitor array is idealized as 1.

b. Set the weight of the redundancy bit

The ideal weight of redundancy bits of the first stage capacitor array equals to the ideal weight of its previous significant bit, namely, $W_{ideal1r}=W_{ideal1i}$;

The ideal weight of redundancy bits of the second stage capacitor array equals to the ideal weight of its previous significant bit, namely, $W_{ideal2r}=W_{ideal2i}$;

The ideal weight of redundancy bits of the m stage capacitor array equals to the ideal weight of its previous significant bit which may lead to multiple equations as follows:

$W_{idealmrk}=2^0=1$ $W_{idealmr(k-1)}=2^1=2$ $W_{idealmr(k-2)}=2^2=4$

...

$W_{idealmr1}=2^{k-1}$

2) Analog-to-digital conversion is carried out leading to a result from comparators and an output code from code reconstruction circuit, wherein, the output code from code reconstruction circuit is used to measure and correct the actual weight of capacitors. The following steps are covered for this procedure:

a. Input a signal with known characteristics, such as sine signal and ramp signal. The signal's amplitude is required to be larger than a half of input signal range of A/D converters;

b. According to the ideal weight, A/D conversion is carried out obtaining a compared result and a code from code reconstruction circuit. The number N of sample points must be more than $2^{n_1+n_2+\ldots+n_m}$, n is a natural number larger than 1.

3) Under the restriction of minimized sum of deviation square, a curve is fit based on output codes from code reconstruction circuit as being described as follows:

Assume input signal is expressed as function f(i), output signal as function $D_{out}(i)$; i and $D_{out}(i)$ are given; based on the minimized sum of deviation square $$\min\sum_i \left(\hat{f}(i)-D_{out}(i)\right)^2,$$

an input signal curve $\hat{f}(i)$ is fit, where i=1, 2, ..., N.

4) The weight of capacitors is estimated based on the difference between the actual output curve and the fit one.

a. Calculate the difference between the first output and the calculated one, the difference err(1) is expressed as follows:

err(1)=$D_{out}(1)-\hat{f}(1)$;

b. According to the proportion of weights, the actual weight of capacitor is expressed as follows:

$$W_{11}(1)=W_{ideal11}-\mu\frac{W_{ideal11}\cdot R_{11}(1)\cdot err(1)}{\sum W_{ideal11}+W_{ideal12}+\ldots+W_{idealmrk}}$$

$$W_{12}(1)=W_{ideal12}-\mu\frac{W_{ideal12}\cdot R_{12}(1)\cdot err(1)}{\sum W_{ideal11}+W_{ideal12}+\ldots+W_{idealmrk}}$$

...

$$W_{mrk}(1)=W_{idealmrk}-\mu\frac{W_{idealmrk}\cdot R_{mrk}(1)\cdot err(1)}{\sum W_{ideal11}+W_{ideal12}+\ldots+W_{idealmrk}}$$

Where, $\mu$ is stepwise regression, $0<\mu<1$.

If process deviation can make sure that the weight of the bits after the p bit of the m capacitor array has no influence on the monotonic of capacitor array, then ignore the capacitor mismatch error of which the weight being less than $W_{mp}$, and take it as an ideal weight which is expressed as equation:

$$W_{11}(1)=W_{ideal11}-\mu\frac{W_{ideal11}\cdot R_{11}(1)\cdot err(1)}{\sum W_{ideal11}+W_{ideal12}+\ldots+W_{idealmp}}$$

$$W_{12}(1)=W_{ideal12}-\mu\frac{W_{ideal12}\cdot R_{12}(1)\cdot err(1)}{\sum W_{ideal11}+W_{ideal12}+\ldots+W_{idealmp}}$$

...

$$W_{mp}(1)=W_{idealmp}-\mu\frac{W_{idealmp}\cdot R_{mp}(1)\cdot err(1)}{\sum W_{ideal11}+W_{ideal12}+\ldots+W_{idealmp}}$$

c. An output is estimated according to the estimated weight.

$D_{out\_est}(1)=R_{11}(2)\cdot W_{11}(1)+R_{12}(2)\cdot W_{12}(1)+\ldots+R_{mrk}(2)\cdot W_{mrk}(1)$ d. The difference between the estimated output and the fit one is calculated as follows:

err(2)=$D_{out\_est}(1)-\hat{f}(2)$ e. According to the error and the proportion of weight, the actual weight of capacitors is re-estimated.

$$W_{11}(2)=W_{11}(1)-\mu\frac{W_{ideal11}\cdot R_{11}(2)\cdot err(2)}{\sum W_{ideal11}+W_{ideal12}+\ldots+W_{idealmrk}}$$

$$W_{12}(2)=W_{12}(1)-\mu\frac{W_{ideal11}\cdot R_{12}(2)\cdot err(2)}{\sum W_{ideal11}+W_{ideal12}+\ldots+W_{idealmrk}}$$

...

-continued $$W_{mrk}(1) = W_{mrk} - \mu \frac{W_{ideal mrk} \cdot R_{mrk}(2) \cdot err(2)}{\sum W_{ideal 11} + W_{ideal 12} + \dots + W_{ideal mrk}}$$

If process deviation can make sure that the weight of the bits after the p bit of the m capacitor array has no influence on the monotonic of capacitor array, then ignore the capacitor mismatch error of which the weight being less than $W_{mp}$, and take it as an ideal weight which is expressed as equation:

$$W_{11}(2) = W_{11}(1) - \mu \frac{W_{ideal 11} \cdot R_{11}(2) \cdot err(2)}{\sum W_{ideal 11} + W_{ideal 12} + \dots + W_{ideal mp}}$$

$$W_{12}(2) = W_{12}(1) - \mu \frac{W_{ideal 12} \cdot R_{12}(2) \cdot err(2)}{\sum W_{ideal 11} + W_{ideal 12} + \dots + W_{ideal mp}}$$

...

$$W_{mp}(2) = W_{mp}(1) - \mu \frac{W_{ideal mp} \cdot R_{mrk}(2) \cdot err(2)}{\sum W_{ideal 11} + W_{ideal 12} + \dots + W_{ideal mp}}$$

f. The cycle of estimation from the step c to step e can be done till the N estimation being completed and there comes out the last estimated weights $W_{11}(N), W_{12}(N), \dots, W_{mrk}(N)$.

Figure 4:
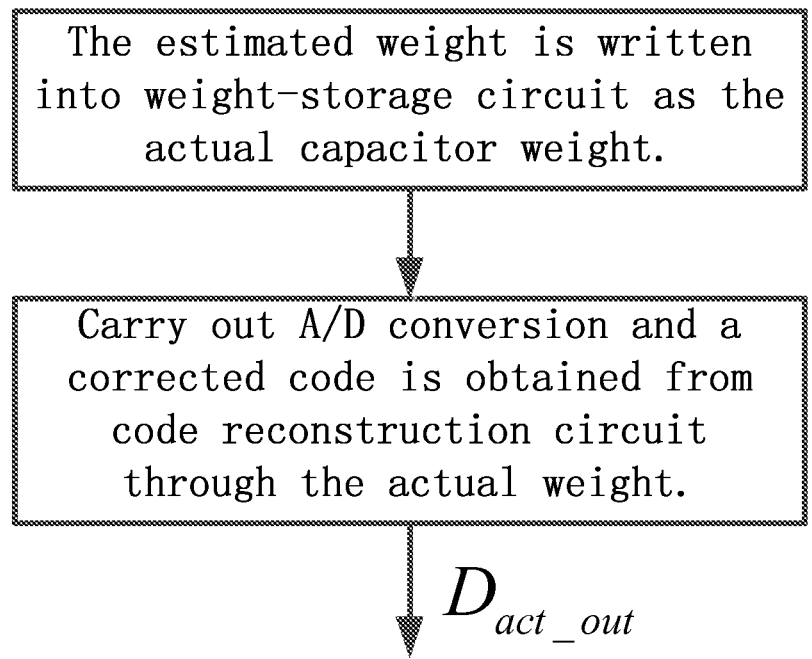
FIG. 4 is a flow chart showing the way to correct capacitor mismatch error for a successive approximation analog-to-digital converter with redundancy bits.

Referring to FIG. 4, the capacitor mismatch error is corrected based on the measured weights of capacitors. The steps are described as follows.

1) The estimated weight of capacitors is written in weight-storage circuit as the actual weight of capacitors.

The last estimated weights $W_{11}(N), W_{12}(N), \dots, W_{mrk}(N)$ are taken as the actual weights of capacitors being written in weight-storage circuit.

$$W_{act11} = W_{11}(N)$$

$$W_{act12} = W_{12}(N)$$

...

$$W_{actmrk} = W_{mrk}(N)$$

2) A/D conversion is carried out. By using the actual weights, the corrected output codes are obtained as expressed as the equation:

$$D_{act\_out} = R_{11} \cdot W_{act11} + R_{12} \cdot W_{act12} + \dots + R_{mrk} \cdot W_{actmrk}$$

The final digital result is obtained through the foregoing steps.

The foregoing preferred embodiments are provided to describe, not to limit, technical approaches in the invention. Obviously, bearing the essence and concept of the invention, technologists in this field can make various changes and redesigns to the invention. It should be understood that those changes and redesigns are also covered by claims of the invention, if they are with the same purpose and within the same scope of the present invention.

What is claimed is:

1. A successive approximation analog-to-digital converter comprising a segmented-multiple-stage capacitor array with redundancy bits, a comparator, a weight-storage circuit, a code reconstruction circuit and a control logic circuit, wherein:

said segmented-multiple-stage capacitor array with redundancy bits is used for sampling input voltage and generating output voltage Vout+ and Vout− under the control of said control logic circuit; the segmented-multiple-stage capacitor array with redundancy bits comprises the first stage capacitor array, the second stage capacitor array, ..., the m stage capacitor array, the first-segment capacitor $C_1$, the second-segment capacitor $C_2, \dots$, the m-1 segment capacitor $C_{(m-1)}$; each of the previous m-1 stages of capacitor arrays comprises no less than 1 redundancy bit; the minimum number of redundancy bit required by the m stage capacitor array depends on the maximum of capacitor mismatch caused by process capability, wherein m is a positive integer no less than 2;

said comparator is employed to compare output voltages Vout+ and Vout− and generate a result;

said weight-storage circuit is employed to store the weight of each capacitor unit of segmented-multiple-stage capacitor array with redundancy bits;

said code reconstruction circuit is employed for successive approximation analog-to-digital converter to calculate an output code according to the output from the comparator and the capacitor's weight from weight-storage circuit; and said control logic circuit is employed to control the foregoing segmented-multiple-stage capacitor array with redundancy bits, comparator, weight-storage circuit and code reconstruction circuit.

2. The successive approximation analog-to-digital converter according to claim 1, wherein the maximum of capacitor mismatch error caused by process and circuit design is expressed as $N_{mismatch\_max}$ LSB (least significant bit); the number of minimum redundancy bit of the m stage capacitor array is expressed as the equation:

$$N_{r\_min} = \log_2(2 \cdot N_{mismatch\_max}).$$

3. The successive approximation analog-to-digital converter according to claim 1, wherein the redundancy bit of segmented-multiple-stage capacitor array is after the significant bit of the same weight.

4. The successive approximation analog-to-digital converter according to claim 1, wherein the first-stage capacitor array of said segmented-multiple-stage capacitor array with redundancy bits comprises positive-end capacitor $C_{11}$, $C_{12}, \dots, C_{1i}, C_{1r}, C_{1(i+1)}, \dots, C_{1n_1}, C_{1n_1}$, and negative-end capacitor $C'_{11}, C'_{12}, \dots, C'_{1i}, C'_{1r}, C'_{1(i+1)}, \dots, C'_{1n_1}, C'_{1n_1}$, wherein $C_{11}$ and $C'_{11}$ make up of one group featuring the same weight $W_{11}$; $C_{12}$ and $C'_{12}$ make up of one group featuring the same weight $W_{12}$; ...; $C_{1n_1}$ and $C'_{1n_1}$ make up of one group featuring the same weight $W_{1n_1}$; redundancy capacitor $C_{1r}$ and $C'_{1r}$ make up of one group featuring the same weight $W_{1r}$, the second stage capacitor array comprises positive-end capacitor $C_{21}, C_{22}, \dots, C_{2i}, C_{2r}, C_{2(i+1)}, \dots, C_{2n_2}$ and negative-end capacitor $C'_{21}, C'_{22}, \dots, C'_{2i}, C'_{2r}, C'_{2(i+1)}, \dots, C'_{2n_2}$ wherein $C_{21}$ and $C'_{21}$ make up of one group featuring the same weight $W_{21}$; $C_{22}$ and $C'_{22}$ make up of one group featuring the same weight $W_{22}$; ...; $C_{n_2}$ and $C'_{2n_2}$ make up of one group featuring the same weight $W_{2n_2}$; redundancy capacitor $C_{2r}$ and $C'_{2r}$ make up of one group featuring the same weight $W_{2r}$;

In the same manner, the m stage capacitor array comprises positive-end capacitor $C_{m1}, C_{m2}, \dots, C_{mi}, C_{mr1}, C_{m(i+1)}, \dots, C_{mn_m}, C_{mr2}, \dots, C_{mrk}$ and negative-end capacitor $C'_{m1}, C'_{m2}, \dots, C'_{mi}, C'_{mr1}, C'_{m(i+1)}, \dots, C'_{mn_m}, C'_{mr2}, \dots, C'_{mrk}$, wherein Capacitor $C_{m1}$ and $C'_{m1}$ make up of one group featuring the same weight $W_{m1}$; Capacitor $C_{m2}$ and $C'_{m2}$ make up of one group featuring the same weight $W_{m2}$; Capacitor $C_{mn_m}$ and $C'_{mn_m}$ make up of one group featuring the same weight $W_{mn_m}$; Capacitor $C_{mr1}$ and $C'_{mr1}$ make up of one group featuring the same weight $W_{mr1}$; ...; and redundancy capacitor $C_{mrk}$ and $C'_{mrk}$ make up of one group featuring the same weight $W_{mrk}$.

5. The successive approximation analog-to-digital converter according to claim 4, wherein said first segment capacitor $C_1$ is twice than the last capacitor $C_{1n_1}$ of the first-stage capacitor array and capacitor $C_1$ equals to $C'_1$; the second segment capacitor $C_2$ is twice than the last capacitor $C_{2n_2}$ of the second-stage capacitor array and capacitor $C_2$ equals to $C'_2$; ...; The m-1 segment capacitor $C_{(m-1)}$ is twice than the last capacitor $C_{(m-1)n_{(m-1)}}$ of the second-stage capacitor array and capacitor $C_{(m-1)}$ equals to $C'_{(m-1)}$.

6. The successive approximation analog-to-digital converter according to claim 1, wherein said segmented-multiple-stage capacitor array with redundancy bits is connected to said comparator by using either differential structure or single-end structure.

7. A method to realize successive approximation analog-to-digital conversion comprising the following steps:
a segmented-multiple-stage capacitor array with redundancy bits samples;
switches of the first-stage capacitor array are connected to $V_{cm}$, and the first-stage capacitor array works to generate the first output voltage Vout+ and Vout−;
the first output voltage Vout+ and Vout− are compared by comparator which outputs a result $R_{11}$;
the result $R_{11}$ is used to control the switch $K_{11}$, generating the second output voltage Vout+ and Vout−;
a code reconstruction circuit is employed to read the weight $W_{11}$ of capacitor $C_{11}$ from weight-storage circuit and calculate a related weight being expressed as the equation $D_{out}=R_{11} \cdot W_{11}$;
the second output voltage Vout+ and Vout− are compared by comparators outputting a result $R_{12}$;
the result $R_{12}$ is used to control the switch $K_{12}$, generating the third output voltage Vout+ and Vout−;
a code reconstruction circuit tends to read the weight $W_{12}$ of capacitor $C_{12}$ from weight-storage circuit and calculate a related weight being added to the previous result as equation $$D_{out}=R_{11} \cdot W_{11}+R_{12} \cdot W_{12};$$

in the same manner till the last switch $K_{mrk}$, an output code is obtained through equation:

$$D_{out}=R_{11} \cdot W_{11}+R_{12} \cdot W_{12}+ \ldots +R_{mrk} \cdot W_{mrk}.$$

8. The method to realize successive approximation analog-to-digital conversion according to claim 7, wherein, if the output voltage Vout+ is larger than Vout−, the comparator outputs 1, otherwise the comparator outputs 0.

9. The method to realize successive approximation analog-to-digital conversion according to claim 7, wherein, the method to measure capacitor mismatch error includes the following steps: the ideal weights of weight-storage circuit is set; analog-to-digital conversion is carried out to generate the comparator output code and the analog-to-digital conversion (ADC) output code; under the restriction of the minimized sum of deviation square, a curve is fit based on output codes from code reconstruction circuit; the actual weight of capacitor is estimated based on the difference between the actual output curve and the fit one.

10. The method to realize successive approximation analog-to-digital conversion according to claim 9, wherein the primitive weight of weight-storage circuit is set with an ideal weight, the method of setting ideal weight comprises the following steps:
set the weight of significant bits, wherein the number of significant bits of the first stage capacitor array is $n_1$, that of the second one is $n_2$ ... the number of significant bits of the m stage capacitor array is $n_m$, so the weight $W_{11}$ of the most significant bit of the first stage capacitor array is idealized as $W_{ideal11}=2^{n_1+n_2+\cdots+n_m-1}$, the weight $W_{12}$ of the second most significant bit of the first stage capacitor array is idealized as $W_{ideal12}=2^{n_1+n_2+\cdots+n_m-2}$, ..., the weight $W_{m1}$ of the most significant bit of the m stage capacitor array is idealized as $W_{idealm1}=2^{n_m-1}$;
the weight $W_{m2}$ of the second most significant bit of the m stage capacitor array is idealized as $W_{idealm2}2^{n_m-2}$, ..., the weight $W_{mn_m}$ of the $n_m$ significant bit of the m stage capacitor array is idealized as 1;
set the weight of the redundancy bit:
the ideal weight of redundancy bits of the first stage capacitor array equals to the ideal weight of its previous significant bit, namely, $W_{ideal1r}=W_{ideal1i}$;
the ideal weight of redundancy bits of the second stage capacitor array equals to the ideal weight of its previous significant bit, namely, $W_{ideal2r}=W_{ideal2i}$;
the ideal weight of redundancy bits of the m stage capacitor array equals to the ideal weight of its previous significant bit which may lead to multiple equations as follows:

$$W_{idealmrk}=2^0=1$$

$$W_{idealmr(k-1)}=2^1=2$$

$$W_{idealmr(k-2)}=2^2=4$$

...

$$W_{idealmr1}=2^{k-1}.$$

11. The method to realize successive approximation analog-to-digital conversion according to claim 9, wherein analog-to-digital conversion is carried out leading to a result of comparators and an output code of code reconstruction circuit, the method of carrying out the result of comparators and the output code of code reconstruction circuit comprises the following steps:
input a signal with known characteristics, such as sine signal and ramp signal, the signal's amplitude is required to be larger than a half of input signal range of A/D converters;
according to the ideal weight, A/D conversion is carried out obtaining a compared result and a code from code reconstruction circuit, the number N of sample points must be more than $2^{n_1+n_2+\cdots+n_m}$, n is a natural number larger than 1.

12. The method to realize successive approximation analog-to-digital conversion according to claim 9, wherein under the restriction of minimized sum of deviation square, a curve is fit based on output codes from code reconstruction circuit, the method of fitting the curve comprises the following steps:
assume input signal is expressed as function f(i), output signal as function $D_{out}(i)$;
i and $D_{out}(i)$ are given;
based on the minimized sum of deviation square $$\min \sum_i \left(\hat{f}(i)-D_{out}(i)\right)^2,$$

an input signal curve $\hat{f}(i)$ is fit, where i=1, 2, ..., N.

13. The method to realize successive approximation analog-to-digital conversion according to claim 12, wherein the actual weight of capacitors is estimated based on the difference between the actual output curve and the fit curve, the method of estimating the actual weight of capacitors comprises the following steps:

a. calculate the difference between the first output and the calculated one, the difference err(1) is expressed as equation err(1)=$D_{out}$(1)−f(1);

b. according to the proportion of weights, the actual weight of capacitor is expressed as follow:

$$W_{11}(1) = W_{ideal11} - \mu \frac{W_{ideal11} \cdot R_{11}(1) \cdot err(1)}{\sum W_{ideal11} + W_{ideal12} + \ldots + W_{idealmrk}}$$

$$W_{12}(1) = W_{ideal12} - \mu \frac{W_{ideal12} \cdot R_{12}(1) \cdot err(1)}{\sum W_{ideal11} + W_{ideal12} + \ldots + W_{idealmrk}}$$

...

$$W_{mrk}(1) = W_{idealmrk} - \mu \frac{W_{idealmrk} \cdot R_{mrk}(1) \cdot err(1)}{\sum W_{ideal11} + W_{ideal12} + \ldots + W_{idealmrk}},$$

Where, μ is stepwise regression, and 0<μ<1 if process deviation can make sure that the weight of the bits after the p bit of the m capacitor array has no influence on the monotonic of capacitor array, then ignore the capacitor mismatch error of which the weight being less than Wmp, and take it as an ideal weight which is expressed as equation:

$$W_{11}(1) = W_{ideal11} - \mu \frac{W_{ideal11} \cdot R_{11}(1) \cdot err(1)}{\sum W_{ideal11} + W_{ideal12} + \ldots + W_{idealmp}}$$

$$W_{12}(1) = W_{ideal12} - \mu \frac{W_{ideal12} \cdot R_{12}(1) \cdot err(1)}{\sum W_{ideal11} + W_{ideal12} + \ldots + W_{idealmp}}$$

...

$$W_{mp}(1) = W_{idealmp} - \mu \frac{W_{idealmp} \cdot R_{mp}(1) \cdot err(1)}{\sum W_{ideal11} + W_{ideal12} + \ldots + W_{idealmp}};$$

c. an output is estimated according to the estimated weight as follow:

$D_{out\_est}$(1)=$R_{11}$(2)·$W_{11}$(1)+$R_{12}$(2)·$W_{12}$(1)+ . . . +$R_{mrk}$(2)·$W_{mrk}$(1);

d. the error between the estimated output and the fit one is calculated as follow:

err(2)=$D_{out\_est}$(1)−f̂(2);

e. according to the error and the proportion of weight, the actual weight of capacitors is re-estimated as follow:

$$W_{11}(2) = W_{11}(1) - \mu \frac{W_{ideal11} \cdot R_{11}(2) \cdot err(2)}{\sum W_{ideal11} + W_{ideal12} + \ldots + W_{idealmrk}}$$

$$W_{12}(2) = W_{12}(1) - \mu \frac{W_{ideal12} \cdot R_{12}(2) \cdot err(2)}{\sum W_{ideal11} + W_{ideal12} + \ldots + W_{idealmrk}}$$

...

$$W_{mrk}(2) = W_{mrk}(1) - \mu \frac{W_{idealmrk} \cdot R_{mrk}(2) \cdot err(2)}{\sum W_{ideal11} + W_{ideal12} + \ldots + W_{idealmrk}};$$

if process deviation can make sure that the weight of the bits after the p bit of the m capacitor array has no influence on the monotonic of capacitor array, then ignore the capacitor mismatch error of which the weight being less than Wmp, and take it as an ideal weight which is expressed as equation:

$$W_{11}(2) = W_{11}(1) - \mu \frac{W_{ideal11} \cdot R_{11}(2) \cdot err(2)}{\sum W_{ideal11} + W_{ideal12} + \ldots + W_{idealmp}}$$

$$W_{12}(2) = W_{12}(1) - \mu \frac{W_{ideal12} \cdot R_{12}(2) \cdot err(2)}{\sum W_{ideal11} + W_{ideal12} + \ldots + W_{idealmp}}$$

...

$$W_{mp}(2) = W_{mp}(1) - \mu \frac{W_{idealmp} \cdot R_{mrk}(2) \cdot err(2)}{\sum W_{ideal11} + W_{ideal12} + \ldots + W_{idealmp}};$$

f. the cycle of estimation from the step c to step e can be done till the N estimation being completed and there comes out the last estimated weights $W_{11}$(N), $W_{12}$(N), . . . , $W_{mrk}$(N).

14. The method to realize successive approximation analog-to-digital conversion according to claim 9, further comprising a step of correcting the capacitor mismatch error, wherein the step of the correcting the capacitor mismatch error comprises the following steps:

the actual weight is written into weight-storage circuit;

analog-to-digital conversion is carried out generating an output code after the correction of the actual capacitor weight.

\* \* \* \* \*